US010203381B2

United States Patent
Meister et al.

(10) Patent No.: US 10,203,381 B2
(45) Date of Patent: Feb. 12, 2019

(54) NMR PROBE HEAD COMPRISING A RELEASABLE HF SEAL

(71) Applicant: Bruker BioSpin AG, Faellanden (CH)

(72) Inventors: Roger Meister, Hinteregg (CH); Daniel Schmidig, Schaffhausen (CH)

(73) Assignee: BRUKER BIOSPIN AG, Faellanden (CH)

( * ) Notice: Subject to any disclaimer, the term of this patent is extended or adjusted under 35 U.S.C. 154(b) by 0 days.

(21) Appl. No.: 15/988,508

(22) Filed: May 24, 2018

(65) Prior Publication Data

US 2018/0340993 A1    Nov. 29, 2018

(30) Foreign Application Priority Data

May 24, 2017   (DE) .................. 10 2017 208 841

(51) Int. Cl.
  *G01R 33/36*  (2006.01)
  *G01R 33/34*  (2006.01)
  *G01R 33/30*  (2006.01)

(52) U.S. Cl.
  CPC ....... *G01R 33/3685* (2013.01); *G01R 33/307* (2013.01); *G01R 33/34007* (2013.01)

(58) Field of Classification Search
  CPC .......... G01R 33/3685; G01R 33/34007; G01R 33/307
  See application file for complete search history.

(56) References Cited

U.S. PATENT DOCUMENTS 3,525,928 A   8/1970   Nagao
5,262,727 A   11/1993  Behbin et al.
(Continued)

FOREIGN PATENT DOCUMENTS

DE    4201440 A1    7/1993
DE    4304871 A1    8/1993
(Continued)

OTHER PUBLICATIONS

Office Action in corresponding German Application 102017208841. 9, dated Feb. 15, 2018, along with English Translation.
(Continued)

*Primary Examiner* — Dixomara Vargas
(74) *Attorney, Agent, or Firm* — Edell, Shapiro & Finnan, LLC

(57) ABSTRACT

An NMR probe head (1) comprising one or more HF coils (2) arranged around a vertical axis of symmetry (z), and an HF network (3) surrounded by an apparatus (4) for shielding from external HF radiation comprising an electrically conductive shielding tube (5) arranged along a z-axis and that can be moved around the HF coils and the HF network in a z direction towards a base disc (6)A shielding disc (7) is provided at an axial distance from the base disc, wherein a tensible HF seal (8) is arranged between the shielding disc and the shielding tube. When the shielding tube is in a mounted state, the HF seal, in a first mounting state, can slide over the shielding disc in an unbraced and force-free manner. When the HF seal is in a second mounting state, the HF seal is mechanically braced between the shielding disc and the shielding tube to ensure an electrically conductive connection.

21 Claims, 3 Drawing Sheets

(56) References Cited

U.S. PATENT DOCUMENTS

| | | | |
|---|---|---|---|
| 6,466,019 B2 | 10/2002 | Marek | |
| 6,563,317 B2 | 5/2003 | Warden et al. | |
| 7,417,432 B2* | 8/2008 | Overweg | G01R 33/4215 |
| | | | 324/318 |
| 7,665,312 B2* | 2/2010 | Jonas | F25D 19/006 |
| | | | 324/318 |
| 7,667,215 B2* | 2/2010 | Hargrove, Jr. | A61B 6/107 |
| | | | 250/505.1 |
| 8,106,736 B2* | 1/2012 | Calvert | G01R 33/3802 |
| | | | 335/216 |
| 8,162,977 B2* | 4/2012 | Bonutti | A61B 17/0487 |
| | | | 606/232 |
| 9,335,389 B2* | 5/2016 | Takegoshi | G01R 33/30 |
| 9,372,247 B2* | 6/2016 | Takegoshi | G01R 33/31 |
| 9,386,940 B2* | 7/2016 | Friman | G01R 33/30 |
| 9,726,735 B2 | 8/2017 | Schmidig et al. | |
| 9,750,496 B2* | 9/2017 | Bonutti | A61B 17/0487 |
| 2007/0173715 A1* | 7/2007 | Jonas | F25D 19/006 |
| | | | 600/410 |
| 2007/0188173 A1* | 8/2007 | Overweg | G01R 33/385 |
| | | | 324/318 |
| 2008/0060843 A1 | 3/2008 | Ginanneschi | |
| 2008/0149864 A1* | 6/2008 | Hargrove | A61B 6/107 |
| | | | 250/515.1 |
| 2011/0284192 A1 | 11/2011 | Grossniklaus et al. | |
| 2011/0291782 A1* | 12/2011 | Calvert | G01R 33/3802 |
| | | | 335/299 |
| 2014/0354279 A1 | 12/2014 | Dumoulin et al. | |
| 2018/0045797 A1 | 2/2018 | Hinderer et al. | |

FOREIGN PATENT DOCUMENTS

| | | |
|---|---|---|
| DE | 102013212312 B4 | 12/2014 |
| DE | 102016214731 B4 | 7/2017 |

OTHER PUBLICATIONS

Firmen-Druckschrift, "HF immunity modifications", Bruker BioSpin AG, 2007, 1 page.

Bertolino et al.: "Design and characterization of an RF shield for a 400 MHz birdcage coil in a retrofitted PET camera for preclinical PET-MRI", Proceedings of the International Society for Magnetic Resonance in Medincin, ISMRM, 25th Annual Meeting and Exhibition, 3 pages, Apr. 7, 2017.

Chunqi Qian et al.: "A volume birdcage coil with an adjustable sliding tuner ring for neuroimaging in high field vertical magnets: and applications at 21.1T", Journal of Magnetic Resonance, vol. 221, pp. 110-116, May 30, 2012.

* cited by examiner

NMR PROBE HEAD COMPRISING A RELEASABLE HF SEAL

CROSS REFERENCE TO RELATED APPLICATIONS

This application claims foreign priority under 35 U.S.C. § 119(a)-(d) to German Application No. 10 2017 208 841.9 filed on May 24, 2017, the entire contents of which are hereby incorporated into the present application by reference.

FIELD OF THE INVENTION

Aspects of the invention relate to a nuclear magnetic resonance (NMR) probe head comprising one or more high frequency (HF) coils arranged around a preferably vertical z-axis, and an HF network, that are surrounded by an apparatus for shielding from external HF radiation comprising an electrically conductive shielding tube that is arranged along the z-axis and can moved around the HF coils and the HF network in a z direction towards a base disc.

BACKGROUND

NMR spectroscopy is an efficient method of instrumental analysis. In this process, HF pulses are radiated into an analysis sample, which is located in a strong, static magnetic field, and the HF reaction of the analysis sample is measured. Thereupon, the information is obtained integrally over a specific region of the analysis sample, the so-called active volume. The analysis sample generally consists of a cylindrical sample tube that contains the measurement substance to be studied, in solid or liquid form. The sample tube is typically located in a spinner. The sample tube and the spinner are transported into the NMR probe head from outside the magnet, using a transport system. When the sample tube is in the measuring position, the spinner is inside the turbine. The turbine allows the sample tube to rotate. In the measuring position, the sample tube is surrounded by one or more NMR coils. The innermost NMR coil has an inside diameter that is larger than the outside diameter of the analysis sample by as little as possible, since the bulk factor, and thus the sensitivity, of the NMR coil is dependent on the inside diameter and decreases as the inside diameter increases.

A HF seal is used to electrically "seal off" the HF network. However, if this HF seal is to be placed relatively high on the NMR probe head, almost the entire shielding tube has to be moved over this seal. This process can lead, inter alia, to damage to the seal. Moreover, a relatively large force is required to mount or dismantle the shielding tube, which can again cause damage to the seal and to the HF structure. In addition to the HF-tightness, a good electrical earthing contact is also desired.

When mounting the shielding tube according to the prior art, said tube brushes over the HF seal. This generates a relatively large force in the axial (mounting) direction. This force and the edges of the components can therefore destroy the HF seal due to high friction and resulting shearing.

In the concept of the so-called "SmartProbe" in company publication "HF immunity modifications" by Bruker BioSpin AG, Industriestrasse 26, CH-8117 Fallanden, Switzerland, dated 2007) currently used in the prior art, the HF seal is positioned at the bottom of the base disc. In a more recent concept, the so-called iProbe, this seal is positioned at the halfway point for conceptual reasons. When the HF sealing concept remains the same, when mounting the shielding tube in the case of the iProbe, an HF seal would probably, if not certainly, be destroyed, since the shielding tube brushes over the seal across a very long stretch. In addition, the high forces in production cannot be controlled so precisely for mounting not to cause any damage to other components.

SUMMARY

It is an object of the present invention to modify an NMR probe head of the type defined above, using simple technical measures, such that the disadvantages listed above are prevented as much as possible, with the shielding tube being able to be mounted and dismantled without force and with a sufficiently large contact force nonetheless existing between the components, after the clamping ring has been tightened, to thus maintain sufficiently good electrical conduction between the parts.

This complex object is achieved in a surprisingly simple as well as effective manner in that, in a generic NMR probe head having the features defined at the outset, a shielding disc is provided at an axial distance from the base disc, in that a tensible HF seal is arranged between the shielding disc and the shielding tube, when the tube is in a mounted state, and which seal is geometrically designed such that, in a first mounting state, the shielding tube can slide over the shielding disc in an unbraced and force-free manner, and that, in a second mounting state, the HF seal can be mechanically braced between the shielding disc and the shielding tube such that an electrically conductive connection to the shielding tube is ensured over the periphery of the shielding disc.

The NMR probe head according to aspects of the invention thus comprises, in addition to the conventional base disc, a shielding disc that is at an axial distance therefrom. In addition, a tensible HF seal is provided there between, which seal is unbraced in a first mounting state and can thus slide over the shielding disc in a force-free manner, thus significantly reducing the above-described risk of damage. After the shielding tube has been mounted, the seal is then braced in order to create the operating state of the NMR probe head. Thus, both very good HF sealing and an excellent electrical connection to earth is achieved.

It is explicitly noted at this point that, although the description of the present invention and the claims always refer, for the sake of linguistic simplicity, to a "vertical z-axis" and to axial positions "above" or "below" the NMR coil system, the advantages of the invention can also be achieved in NMR systems having a horizontal or oblique z-axis. The axial positions specified then no longer necessarily have to be "above" or "below" the NMR coil system, but optionally also to the "right" or "left" thereof. In any case, the force of gravity plays an insignificant role in the operating principle of the present invention.

Embodiments of the NMR probe head according to aspects of the invention in which the shielding tube is prism-shaped, preferably cylindrical, allowing inter alia simple production and handling, have in particular proven themselves in practice.

A class of embodiments of the NMR probe head according to aspects of the invention in which the shielding tube is formed in at least two parts, in particular in multiple parts, in the z-direction is advantageous. In this way, the shielding tube, which is relatively long from the perspective of conventional production, can be divided such that resulting portions are shorter and thus simpler to manufacture in terms of production engineering, and such that the portions can be divided into a portion which, in terms of dimensions, has smaller manufacturing tolerances, and a "less precise" portion, which has a positive effect overall on the manufacturing costs.

In preferred developments of this class of embodiments, the shielding tube comprises a first sub-portion which, in the operating state of the NMR probe head, surrounds an analysis sample below the shielding disc. The precise portion of the shielding tube then needs to be only as long as is necessarily required by the extension of the HF region to be shielded.

Variants of these arrangements that are preferred include, wherein the first sub-portion of the shielding tube has a standard length of between 100 mm and 500 mm, preferably approximately 300 mm, while a second sub-portion of the shielding tube has a selectable, arbitrary length in the z-direction, preferably as a cylindrical tube. An essential advantage is that the precise portion of the shielding tube is always the same for all variants of probe head lengths. As a result, high-precision parts in particular can be produced in large quantities, which in turn has a positive effect on reducing the production costs. When the first sub-portion of the shielding tube is cylindrical, clamping of the seal is particularly simple, and the production is also simplified.

Other developments of the above-described class of embodiments of the invention include that the sub-portions of the multiple-part shielding tube are integrally interconnected, in particular adhesively bonded or welded, before being mounted in the NMR probe head. This allows for a very space-saving connection. Following the adhesive bonding, the multiple-part shielding tube can then be further processed as a tried and tested integral shielding tube.

Advantageous developments of embodiments described above can additionally provide for the shielding tube, at least its first sub-portion, to have an electrical conductivity of $\sigma \geq 30*10^6$ Siemens/meter. In this case, just the first sub-portion needs an electrically conductive (and therefore more expensive) layer. The second sub-portion can be quite simply and cost-effectively anodized for example.

A class of embodiments in which the tensible HF seal contains a spring element that presses against an edge portion of the shielding disc in the second mounting state is also particularly preferred. A minimum contact pressure can thus be generated without causing plastic deformation of contact fingers. At the same time, manufacturing tolerances in the shielding disc—HF seal—shielding tube system can be accommodated.

In advantageous developments of these embodiments, the edge portion of the shielding disc is conical, such that length-independent bracing of the contact springs can thus be achieved. The springs are always at the correct location, regardless of whether slightly more or slightly less force is applied.

An embodiment of the NMR-probe head according to aspects of the invention wherein a clamping ring is arranged radially between the shielding tube and the shielding disc is also preferred. This clamping ring can allow a rotational movement for clamping the HF seal without the HF seal rotating itself.

A development of this embodiment and/or the embodiment described previously provides for the spring element to comprise a plurality of contact fingers which are pressed, by the clamping ring, over a cone between the shielding disc and the shielding tube and thus establish electrical contact between the shielding tube and the shielding disc. Dividing the contact into a plurality of small contacts makes it possible to ensure clean contact on the periphery at all times.

Further advantageous variants of these developments and/or the developments described previously provide for the conical edge portion of the shielding disc to be designed such that no self-locking of the contact fingers occurs when the HF seal is released, the cone angle in particular being $\geq 15°$. When the correct angle is selected, the HF seal can always slide back into the unclamped position in which the shielding tube can be mounted in a force-free manner.

A further preferred embodiment of the NMR probe head according to the invention includes a chuck key is provided, by which the tensible HF seal can be clamped or released. Using a special chuck key prevents the clamping ring from being released during operation. An element for clamping the clamping ring is incidentally required in any case. Advantageous developments of these embodiments include the chuck key for clamping or releasing the HF seal is temporarily attached at the side or from below.

An NMR measurement assembly comprising an NMR probe head according to aspects of the invention as described above, which assembly may also comprise an NMR magnet system, a shim system, a turbine and a device for transporting a sample tube from outside the NMR magnet system into the measuring position of the sample tube in the NMR probe head, is also covered by the scope of the present invention. The releasable HF seal according to aspects of the invention is important in particular in the overall system of the NMR probe head, NMR magnet and transport device, since this combination allows the sample tubes to be changed automatically, which is very important in high-throughput NMR applications for example. The assembly according to aspects of the invention makes an important contribution for these applications, since it prevents damage to the NMR probe head when the HF seal is inserted.

Further advantages of the invention can be found in the description and the drawings. Likewise, the features mentioned above and set out in the following, according to aspects of the invention, can each be used individually or together in any combination.

The embodiments shown and described are not to be understood as an exhaustive list, but instead are of an exemplary nature for describing aspects of the invention.

DESCRIPTION OF THE DRAWINGS

Aspects of the invention are shown in the drawings and will be described in greater detail with reference to embodiments. In the drawings.

DETAILED DESCRIPTION

Figure 1A:
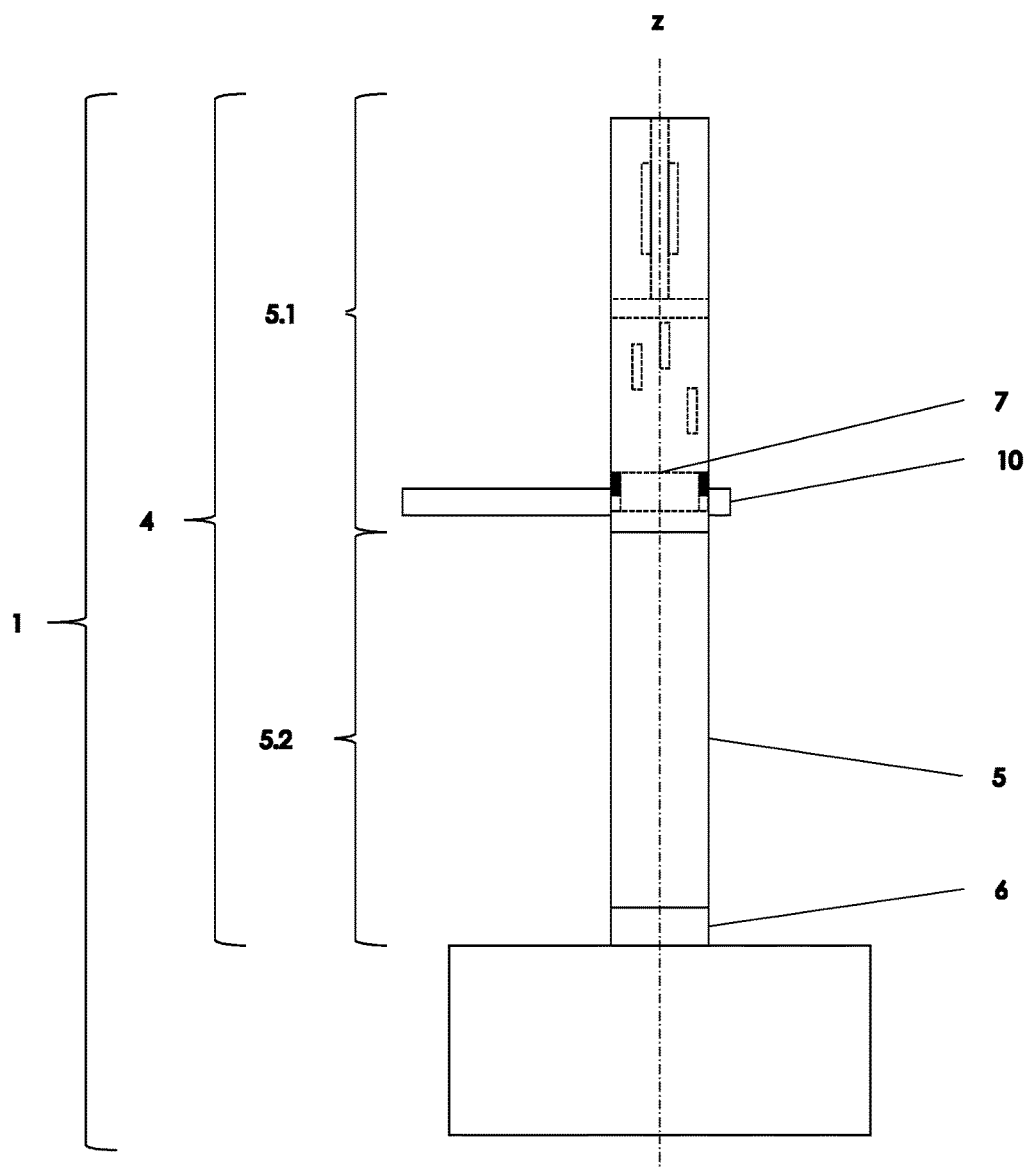
FIG. 1A is a schematic vertical section of an NMR probe head in an unbraced first mounting state of the HF seal before it is mounted or after it is dismantled according to embodiments of the invention.

An object of the invention relates to damage-free mounting of an HF seal in an NMR probe head.

An NMR probe head 1 of this kind generically comprises one or more HF coils 2 arranged around a vertical axis of symmetry z of an NMR magnet coil assembly and an HF network 3 that are surrounded by an apparatus 4 for shielding from external HF radiation comprising an electrically conductive shielding tube 5 that is arranged along the z-axis and can be moved around the HF coils 2 and the HF network 3 in the z direction towards a base disc 6.

Aspects of the present invention include a shielding disc 7 that is provided at an axial distance from the base disc 6, in that a tensible HF seal 8 is arranged between the shielding disc 7 and the shielding tube 5, when the tube is in a mounted state, and which seal is geometrically designed such that, in a first mounting state, the shielding tube 5 can slide over the shielding disc 7 in an unbraced and force-free manner, and that, in a second mounting state, the HF seal 8 can be mechanically braced between the shielding disc 7 and the shielding tube 5 such that an electrically conductive connection to the shielding tube 5 is ensured over the periphery of the shielding disc 7.

In the embodiments shown in the figures, the shielding tube 5 is prism-shaped, in particular cylindrical, and is formed in at least two parts in the z-direction. In the operating state of the NMR probe head 1, a first sub-portion 5.1 surrounds an analysis sample below the shielding disc 7. This first sub-portion 5.1 has a standard length of between 100 mm and 500 mm, while a second sub-portion 5.2 of the shielding tube 5 is designed having a selectable, arbitrary length in the z-direction, preferably as a cylindrical tube. The sub-portions 5.1, 5.2 of the multiple-part shielding tube 5 are integrally interconnected, in particular adhesively bonded or welded, before being mounted in the NMR probe head 1.

Figure 1B:
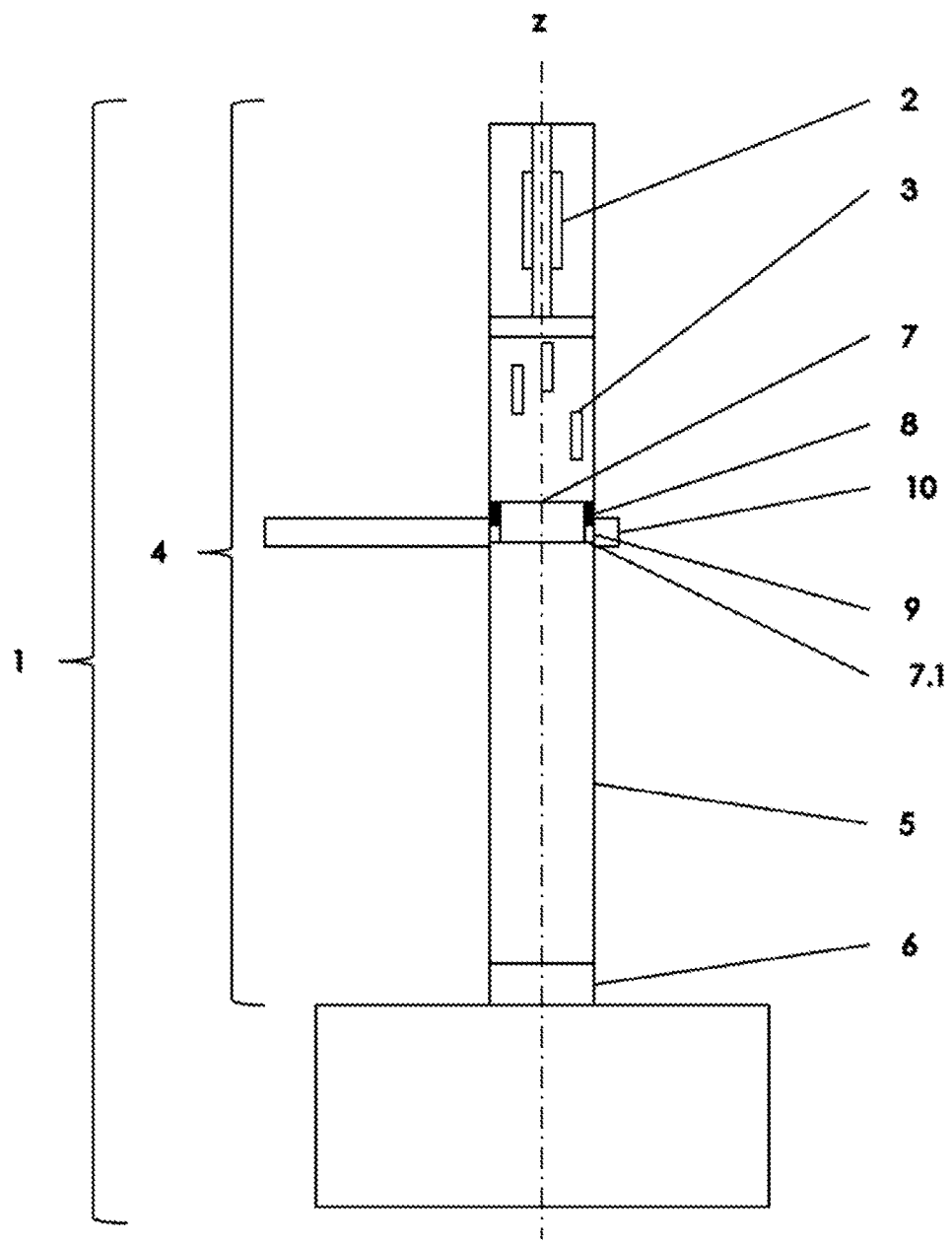
FIG. 1B shows the embodiment according to FIG. 1A ready for use, in the braced second mounting state, after the HF seal is mounted according to embodiments of the invention.

FIGS. 1A and 1B schematically show an embodiment of the NMR probe head 1 according to aspects of the present invention, as described in detail here, together with a device for mounting and dismantling the HF seal 8 without damage. While FIG. 1A shows the tensible HF seal 8 in a first mounting state in which it is not yet mounted or has been dismantled again, and is unbraced and therefore free of force, FIG. 1B shows the configuration in the mounted, ready-for-use mounting state in which the HF seal 8 is mechanically braced between the shielding disc 7 and the shielding tube 5.

Figure 2:
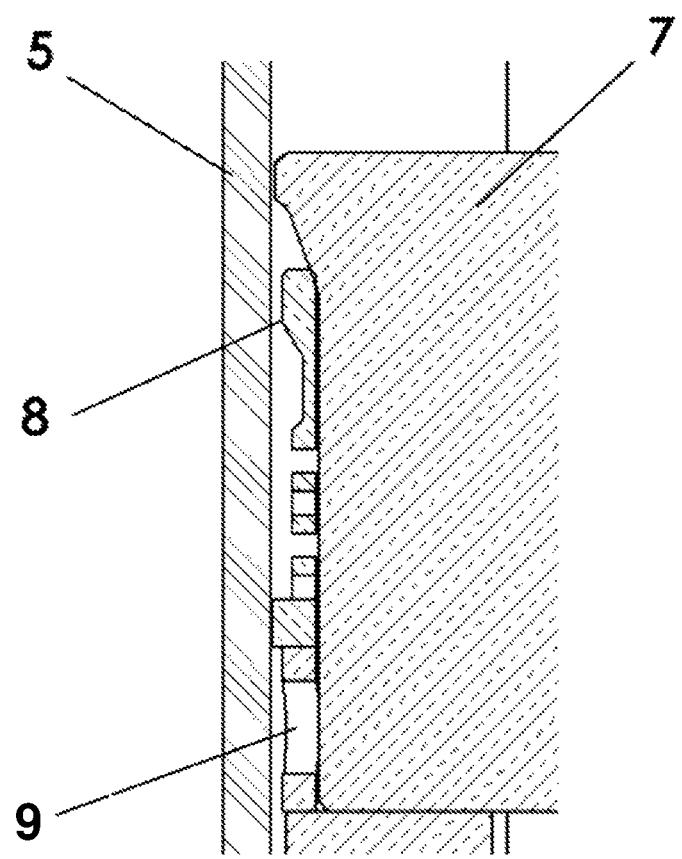
FIG. 2 is a schematic vertical half section showing details of the NMR probe head in the region of the tensible HF seal according to embodiments of the invention.

As can be clearly seen in FIG. 2, the tensible HF seal 8 contains a spring element which, in the second mounting state, presses against an edge portion 7.1 of the shielding disc 7. This edge portion 7.1 of the shielding disc 7 is conical.

A clamping ring 9 is arranged radially between the shielding tube 5 and the shielding disc 7. The spring element (not shown in greater detail in the drawings) can comprise a plurality of contact fingers which are pressed, by the clamping ring 9, over a cone between the shielding disc 7 and the shielding tube 5 and thus establish electrical contact between the shielding tube 5 and the shielding disc 7. The conical edge portion 7.1 of the shielding disc 7 is designed such that no self-locking of the contact fingers occurs when the HF seal 8 is released, with the cone angle in particular being ≥15°.

Furthermore, a chuck key 10 is provided, by which the tensible HF seal 8 can be clamped or released, as shown in FIGS. 1A and 1B. In this case, the chuck key 10 for clamping or releasing the HF seal 8 is temporarily attached at the side or from below.

LIST OF REFERENCE SIGNS

1 NMR probe head
2 HF coils
3 HF network
4 apparatus for shielding from external HF radiation
5 shielding tube
5.1 first sub-portion of the shielding tube
5.2 second sub-portion of the shielding tube
6 base disc
7 shielding disc
7.1 conical edge portion of the shielding disc
8 tensible HF seal
9 clamping ring
10 chuck key
z axis of symmetry of the magnet coil assembly

What is claimed is:

1. An NMR probe head comprising: one or more HF coils arranged around a vertical (z) axis of symmetry and an HF network, surrounded by an apparatus for shielding from external HF radiation comprising:
    an electrically conductive shielding tube that is arranged along the (z) axis and can be moved around the HF coils and the HF network in a z-direction relative to the (z) axis towards a base disc,
    a shielding disc at an axial distance from the base disc, and
    a tensible HF seal arranged between the shielding disc and the shielding tube, when the shielding tube is in a mounted state
        wherein, in a first mounting state, the tensible HF seal is geometrically configured such that the shielding tube can slide over the shielding disc in an unbraced and force-free manner; and
        wherein, in a second mounting state, the tensible HF seal is mechanically braced between the shielding disc and the shielding tube such that an electrically conductive connection to the shielding tube is ensured over the periphery of the shielding disc.

2. The NMR probe head according to claim 1, wherein the shielding tube is prism-shaped.

3. The NMR probe head according to claim 1, wherein the shielding tube is formed in at least two parts in the z-direction.

4. The NMR probe head according to claim 3, wherein the shielding tube comprises a first sub-portion that surrounds an analysis sample below the shielding disc when the NMR probe head is in an operating state.

5. The NMR probe head according to claim 4, wherein the first sub-portion of the shielding tube is configured to have a standard length of between 100 mm and 500 mm, and wherein a second sub-portion of the shielding tube is configured to have a selectable, arbitrary length in the z-direction.

6. The NMR probe head according to claim 5, wherein the first sub-portion and the second sub-portion of the shielding tube are integrally interconnected before being mounted in the NMR probe head.

7. The NMR probe head according to claim 4, wherein at least the first sub-portion of the shielding tube has an electrical conductivity of $\sigma \geq 30*10^6$ Siemens/meter.

8. The NMR probe head according to claim 1, wherein the tensible HF seal comprises a spring element which presses against an edge portion of the shielding disc when in the second mounting state.

9. The NMR probe head according to claim 8, wherein the edge portion of the shielding disc is conical.

10. The NMR probe head according to claim 8, further comprising a clamping ring arranged radially between the shielding tube and the shielding disc.

11. The NMR probe head according to claim 9, further comprising a clamping ring arranged radially between the shielding tube and the shielding disc, wherein the spring element comprises a plurality of contact fingers which are pressed by the clamping ring over a cone between the shielding disc and the shielding tube to establish electrical contact between the shielding tube and the shielding disc.

12. The NMR probe head according to claim 10, wherein the spring element comprises a plurality of contact fingers which are pressed by the clamping ring over a cone between the shielding disc and the shielding tube to establish electrical contact between the shielding tube and the shielding disc.

13. The NMR probe head according to claim 12, wherein the edge portion of the shielding disc is conical.

14. The NMR probe head according to claim 13, wherein the conical edge portion of the shielding disc is configured to prevent self-locking of the contact fingers when the HF seal is released, wherein the cone angle is ≥15°.

15. The NMR probe head according to claim 1, further comprising a chuck key configured to clamp or release the tensible HF seal.

16. The NMR probe head according to claim 15, wherein the chuck key to clamp or release the tensible HF seal is temporarily attached at the side or from below.

17. The NMR probe head according to claim 1, wherein the shielding tube is formed in multiple parts in the z-direction.

18. The NMR probe head according to claim 5, wherein the shielding tube is configured to be in the shape of a cylinder.

19. The NMR probe head according to claim 3, wherein the first sub-portion and second sub-portion of the shielding tube are adhesively bonded or welded before being mounted in the NMR probe head.

20. The NMR probe head according to claim 4, wherein the shielding tube further comprises a second sub-portion configured to have a selectable, arbitrary length in the z-direction, and wherein the first sub-portion and the second sub-portion of the shielding tube are integrally interconnected before being mounted in the NMR probe head.

21. A NMR measurement assembly comprising an NMR probe head, an NMR magnet system, a shim system, a turbine and a device for transporting a sample tube from outside the NMR magnet system into a measuring position of the sample tube in the NMR probe head, wherein the NMR probe head comprises:
one or more HF coils arranged around a vertical (z) axis of symmetry and an HF network, surrounded by an apparatus for shielding from external HF radiation, comprising an electrically conductive shielding tube that is arranged along the (z) axis and can be moved around the HF coils and the HF network in a z-direction relative to the (z) axis towards a base disc,
wherein a shielding disc is provided at an axial distance from the base disc;
wherein a tensible HF seal is arranged between the shielding disc and the shielding tube, when the tube is in a mounted state;
wherein, in a first mounting state, the tensible HF seal is geometrically configured such that the shielding tube can slide over the shielding disc in an unbraced and force-free manner; and
wherein, in a second mounting state, the HF seal is mechanically braced between the shielding disc and the shielding tube such that an electrically conductive connection to the shielding tube is ensured over the periphery of the shielding disc.

\* \* \* \* \*